US010321237B2

(12) United States Patent
Min et al.

(10) Patent No.: US 10,321,237 B2
(45) Date of Patent: Jun. 11, 2019

(54) MULTI-LAYER VOICE COIL PLATE AND FLAT TYPE SPEAKER COMPRISING THE SAME

(71) Applicant: ICUBES CO., LTD, Gyeonggi-do (KR)

(72) Inventors: Dong Hoon Min, Gyeonggi-do (KR); Joo Bae Kim, Gyeonggi-do (KR); Soon Kwan Kwon, Gyeonggi-do (KR)

(73) Assignee: ICUBES CO., LTD, Gyeonggi-Do (KR)

( * ) Notice: Subject to any disclaimer, the term of this patent is extended or adjusted under 35 U.S.C. 154(b) by 0 days.

(21) Appl. No.: 15/569,385

(22) PCT Filed: Apr. 28, 2016

(86) PCT No.: PCT/KR2016/004486
§ 371 (c)(1),
(2) Date: Oct. 26, 2017

(87) PCT Pub. No.: WO2016/175592
PCT Pub. Date: Nov. 3, 2016

(65) Prior Publication Data
US 2018/0295451 A1 Oct. 11, 2018

(30) Foreign Application Priority Data
Apr. 28, 2015 (KR) .......................... 10-2015-0059789

(51) Int. Cl.
H04R 9/02 (2006.01)
H04R 9/06 (2006.01)
(Continued)

(52) U.S. Cl.
CPC ................. H04R 9/06 (2013.01); H04R 7/04 (2013.01); H04R 7/18 (2013.01); H04R 9/025 (2013.01);
(Continued)

(58) Field of Classification Search
CPC . H04R 7/04; H04R 7/18; H04R 9/025; H04R 9/046; H04R 9/06
See application file for complete search history.

(56) References Cited

U.S. PATENT DOCUMENTS 8,953,834 B2 * 2/2015 Kim .................. H04R 9/047
381/401

FOREIGN PATENT DOCUMENTS

KR 20-0291150 10/2002
KR 10-2009-0104325 10/2009
(Continued)

OTHER PUBLICATIONS

International Search Report for PCT/KR2016/004486 dated Aug. 19, 2016 and its English translation from WIPO.
(Continued)

Primary Examiner — Brian Ensey
(74) Attorney, Agent, or Firm — Ladas & Parry, LLP

(57) ABSTRACT

A multilayer voice coil plate and a flat speaker including the same are capable of significantly reducing difficulties in designing and manufacturing a multilayer voice coil pattern. The multilayer voice coil plate may include: a first-type voice coil pattern layer formed in the shape of a track and connected from a first outer via hole outside the track to an inner via hole disposed in the track; and a second-type voice coil pattern layer formed in the shape of a track and connected from a second outer via hole outside the track to an inner via hole disposed in the track. The plurality of first-type voice coil pattern layers and the plurality of second-type voice coil pattern layers may be stacked so as to be insulated from each other, and the first outer via holes, the second outer via holes and the inner via holes may be electrically connected through interlayer conductors, respectively.

13 Claims, 5 Drawing Sheets

(51) Int. Cl.
  *H04R 9/04* (2006.01)
  *H05K 1/16* (2006.01)
  *H04R 7/04* (2006.01)
  *H04R 7/18* (2006.01)
(52) U.S. Cl.
  CPC .............. *H04R 9/04* (2013.01); *H04R 9/046* (2013.01); *H05K 1/16* (2013.01)

(56) References Cited

FOREIGN PATENT DOCUMENTS

| KR | 10-2011-0135468 | 12/2011 |
| KR | 10-1147904 | 5/2012 |
| KR | 10-2014-0066540 | 6/2014 |

OTHER PUBLICATIONS

Written Opinion of the International Searching Authority for PCT/KR2016/004486 dated Aug. 19, 2016 and its English machine translation by Google Translate.

Office Action dated Mar. 8, 2016 for Korean Patent Application No. 10-2015-0059789 and its English translation by Global Dossier.

* cited by examiner (a)

(b)

MULTI-LAYER VOICE COIL PLATE AND FLAT TYPE SPEAKER COMPRISING THE SAME

CROSS-REFERENCE TO RELATED APPLICATIONS

This application is the U.S. National Stage of International Patent Application No. PCT/KR2016/004486 filed on Apr. 28, 2016, which claims the priority to Korean Patent Application No. 10-2015-0059789 filed in the Korean Intellectual Property Office on Apr. 28, 2015, the entire contents of which are incorporated herein by reference.

TECHNICAL FIELD

The present disclosure relates to a flat speaker, and more particularly, to a multilayer voice coil plate and a flat speaker including the same.

BACKGROUND ART

A speaker refers to a device that includes a voice coil and a vibration plate which are arranged in a magnetic field, and generates compressional waves as sound waves in the air by vibrating the vibration plate using a Lorentz force which is generated in the voice coil by an electrical signal. Conventionally, electrodynamic loudspeakers have been widely used, which vibrate a cone-shaped vibration plate using a voice coil wound in a cylindrical shape. Recently, however, the use of flat speakers capable of reducing a speaker installation space has increased, with the reduction in size and thickness of display devices or mobile terminals in which audio systems mounted.

The flat speaker generally includes a pair of magnetic bodies, a voice coil plate and a vibration plate. The pair of magnetic bodies are arranged with a predetermined space provided therebetween, and thus form a magnetic space for a magnetic field therebetween, the voice coil plate is disposed in the magnetic field, and the vibration plate is vertically coupled to an upper edge of the voice coil plate, and vibrated by a motion of the voice coil plate. The voice coil plate includes a plate or film-shaped base substrate and a voice coil pattern. The voice coil pattern is wound in a track shape or printed in a similar manner on the surface of the base substrate.

In order to generate a higher electromagnetic force in a limited-area voice coil plate, the integration density of the voice coil pattern must be increased. However, there is a limitation in increasing the number of windings by reducing the line width of the coil pattern, due to an increase of resistance. In order to overcome such a limitation, various techniques have been developed. According to one of the techniques, voice coil patterns may be formed on one or both surfaces of several base substrates, and the base substrates may be vertically stacked. Further, voice coil patterns of two layers adjacent to each other may be connected in series to each other in order to acquire an appropriate resistance value depending on the design intention in a multilayer voice coil plate.

According to the related arts, however, the shapes or lengths of the voice coil patterns are different from each other, the shapes of the voice coil patterns including the positions of via holes for connecting the respective layers of the voice coil patterns. Therefore, the voice coil patterns need to be designed for the respective layers. When the resistance value is changed by a difference in shape or length between the voice coil patterns at each of the layers, it is more difficult to adjust the composite resistance value of the entire voice coil plate to the target resistance value depending on the design intention.

Furthermore, the stacked structures according to the related arts require one base substrate for each layer or at least one base substrate for each two layers of the multilayer voice coil patterns. Thus, the thickness and mass of the voice coil plate are inevitably increased to thereby degrade the effect obtained by increasing the number of coil windings.

DISCLOSURE

Technical Problem

Various embodiments are directed to a voice coil plate which can simplify an interlayer connection structure of a multilayer voice coil pattern in order to implement the voice coil plate only by designing a small number of voice coil patterns even though the number of voice coil pattern layers stacked therein is increased, thereby reducing the time and effort required for designing and manufacturing a multilayer voice coil pattern that satisfies a target resistance value, and a flat speaker including the same.

Also, various embodiments are directed to a voice coil plate with improved stacking structure of a multilayer voice coil patterns in order to not only reduce the number of base substrates to ½ or less of the number of voice coil pattern layers, but also reduce the thickness and mass of the voice coil plate, thereby improving an effect obtained through an increase in number of coil windings, and a flat speaker including the same.

Technical Solution

In an embodiment, a multilayer voice coil plate may include: a first-type voice coil pattern layer formed in the shape of a track and connected from a first outer via hole outside the track to an inner via hole disposed in the track; and a second-type voice coil pattern layer formed in the shape of a track and connected from a second outer via hole outside the track to an inner via hole disposed in the track.

The plurality of first-type voice coil pattern layers and the plurality of second-type voice coil pattern layers may be stacked so as to be insulated from each other, and the first outer via holes and the second outer via holes may be electrically connected through interlayer conductors, respectively. The inner via holes of the plurality of first-type voice coil pattern layers and the inner via holes of the plurality of second-type voice coil pattern layers may be vertically aligned at the same position, and electrically connected to each other through an interlayer conductor.

The plurality of first-type voice coil pattern layers may be connected in parallel to each other between the first outer via hole and the inner via hole, the plurality of second-type voice coil pattern layers may be connected in parallel to each other between the inner via hole and the second outer via hole, and the plurality of first-type voice coil pattern layers and the plurality of second-type voice coil pattern layers other may be connected in series to each other through the inner via hole set to a contact therebetween.

In another embodiment, a multilayer voice coil plate may include: a pair of base substrates facing each other; inner voice coil pattern layers formed on both surfaces of each of the pair of base substrates, respectively; insulating films covering the respective surfaces of the inner voice coil pattern layers on both surfaces of each of the pair of base substrates; and an outer voice coil pattern layer formed on each of the insulating films of outer surfaces of the pair of base substrates, with an adhesive layer interposed therebetween. Two insulating films on inner surfaces of the pair of base substrates, facing each other, may be bonded to each other with an adhesive layer.

Each of the plurality of voice coil pattern layers including the inner voice coil pattern layers and the outer voice coil pattern layers may be a first-type or second-type voice coil pattern layer, the first-type voice coil pattern layer may be formed in the shape of a track and connected from a first outer via hole outside the track to an inner via hole in the track, the second-type voice coil pattern layer may be formed in the shape of a track and connected from a second outer via hole outside the track to the inner via hole in the track, and the first outer via holes, the second outer via holes and the inner via holes in the plurality of voice coil pattern layers may be electrically connected through interlayer conductors, respectively.

The plurality of voice coil pattern layers may include the plurality of first-type voice coil pattern layers and the plurality of second-type voice coil pattern layers. The plurality of first-type voice coil pattern layers may be connected in parallel to each other between the first outer via hole and the inner via hole, the plurality of second-type voice coil pattern layers may be connected in parallel to each other between the inner via hole and the second outer via hole, and the plurality of first-type voice coil pattern layers and the plurality of second-type voice coil pattern layers may be connected in series to each other through the inner via hole set to a contact therebetween. The first-type voice coil pattern layer and the second-type voice coil pattern layer may be stacked in such a manner that the inner via holes thereof are vertically aligned at the same position.

In another embodiment, a flat speaker may include: a multilayer voice coil plate; a vibration plate vertically coupled to un upper edge of the multilayer voice coil plate, and configured to vibrate in a direction parallel to the multilayer voice coil plate; a first input terminal installed adjacent to a first end of the multilayer voice coil plate; and a second input terminal installed adjacent to a second end of the multilayer voice coil plate.

The multilayer voice coil plate may include: a first-type voice coil pattern layer formed in the shape of a track and connected from a first outer via hole outside the track to an inner via hole disposed in the track; and a second-type voice coil pattern layer formed in the shape of a track and connected from a second outer via hole outside the track to an inner via hole disposed in the track. The plurality of first-type voice coil pattern layers and the plurality of second-type voice coil pattern layers may be stacked so as to be insulated from each other, and the first outer via holes and the second outer via holes may be electrically connected through interlayer conductors, respectively. The inner via holes of the plurality of first-type voice coil pattern layers and the inner via holes of the plurality of second-type voice coil pattern layers may be vertically aligned at the same position, and electrically connected to each other through an interlayer conductor.

The plurality of first-type voice coil pattern layers may be connected in parallel to each other between the first outer via hole and the inner via hole, the plurality of second-type voice coil pattern layers may be connected in parallel to each other between the inner via hole and the second outer via hole, and the plurality of first-type voice coil pattern layers and the plurality of second-type voice coil pattern layers may be connected in series to each other through the inner via hole set to a contact therebetween.

In another embodiment, a flat speaker may include: a multilayer voice coil plate; a vibration plate vertically coupled to an upper edge of the multilayer voice coil plate, and configured to vibrate in a direction parallel to the multilayer voice coil plate; a first input terminal installed adjacent to a first end of the multilayer voice coil plate; and a second input terminal installed adjacent to a second end of the multilayer voice coil plate.

The multilayer voice coil plate may include: a pair of base substrates facing each other; inner voice coil pattern layers formed on both surfaces of each of the pair of base substrates, respectively; insulating films covering the respective surfaces of the inner voice coil pattern layers on both surfaces of each of the pair of base substrates; and an outer voice coil pattern layer formed on the insulating film of each of outer surfaces of the pair of base substrates, with an adhesive layer interposed therebetween. Two insulating films of inner surfaces of the pair of base substrates, facing each other, may be bonded to each other through an adhesive layer.

Each of the plurality of voice coil pattern layers including the inner voice coil pattern layers and the outer voice coil pattern layers may be a first-type or second-type voice coil pattern layer, the first-type voice coil pattern layer may be formed in the shape of a track and connected from a first outer via hole outside the track to an inner via hole in the track, the second-type voice coil pattern layer may be formed in the shape of a track and connected from a second outer via hole outside the track to the inner via hole in the track, and the first outer via holes, the second outer via holes and the inner via holes in the plurality of voice coil pattern layers may be electrically connected through interlayer conductors, respectively.

Advantageous Effects

According to the embodiments of the present invention, the multilayer voice coil plate and the flat speaker including the same can simplify the interlayer connection structure of the multilayer voice coil pattern in order to implement the voice coil plate only by designing a small number of voice coil patterns even though the number of voice coil pattern layers stacked therein is increased, thereby reducing the time and effort required for designing and manufacturing a multilayer voice coil pattern that satisfies a target resistance value.

The voice coil plate and the flat speaker including the same can improve the stacked structure of the multilayer voice coil pattern in order to not only reduce the number of base substrates to ½ or less of the number of voice coil pattern layers, but also reduce the thickness and mass of the voice coil plate, thereby improving an effect obtained through the increase in number of coil windings.

MODE FOR INVENTION

Hereafter, exemplary embodiments of the present invention will be described in detail with reference to the accompanying drawings. The following embodiments can be modified in various manners, and the scope of the present invention is not limited to the embodiments. The embodiments are provided so that this disclosure will be thorough and complete, and will fully convey the scope of the present invention to those skilled in the art.

Figure 1:
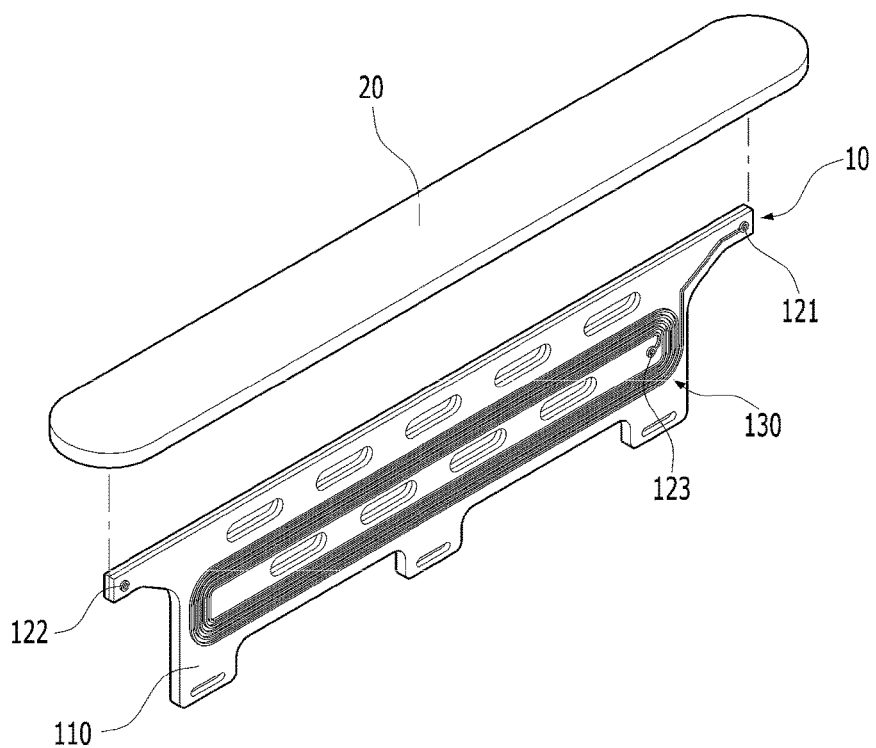
FIG. 1 illustrates a voice coil plate and a vibration plate in a flat speaker according to an embodiment of the present invention.

FIG. 1 illustrates a voice coil plate and a vibration plate in a flat speaker according to an embodiment of the present invention.

As illustrated in FIG. 1, the flat speaker includes a voice coil plate 10 and a vibration plate 20 which is vertically coupled to an upper edge of the voice coil plate 10. The voice coil plate 10 has a multilayer structure including one or more base substrates 110 and a plurality of voice coil patterns stacked on both surfaces of the base substrate 110. FIG. 1 illustrates only the voice coil pattern 130 which is disposed at the uppermost layer of the voice coil plate 10 so as to face the front. However, it is obvious to those skilled in the art that a plurality of voice coil patterns are stacked under the voice coil pattern 130 in the thickness direction of the voice coil plate 10.

The base substrate 110 may be formed of a synthetic resin film such as polyimide (PI), for example. The voice coil pattern 130 may be formed as a track-shaped conductive pattern. The conductive pattern may be formed of a metal thin film with high conductivity, such as copper (Cu), silver (Ag) or chrome (Cr), or include various metal thin films stacked therein. The conductive pattern may be formed through various techniques such as vacuum deposition, lithography, plating, rolling and inkjet printing, which are applied to the printed circuit board (PCB) fabrication.

The voice coil pattern 130 may be formed in a track shape which is elongated along the longitudinal direction of the base substrate 110. The voice coil pattern 130 is formed as one line connected from an inner end to an outer end thereof, like a coil wound in a track shape. The inner end of the track-shaped voice coil pattern is connected to an inner via hole 123, and the outer end of the voice coil pattern is connected to a first outer via hole 121 disposed outside the track shape. Furthermore, a second outer via hole 122 is disposed at a position different from the first outer via hole 121 outside the track shape, for example, at the opposite position of the first outer via hole 121. Unlike the uppermost voice coil pattern 130 of FIG. 1, the plurality of voice coil patterns in the plurality of voice coil pattern layers covered by the uppermost voice coil pattern 130 have an outer end connected to the second outer via hole 122 and an inner end connected to the inner via hole 123.

In the voice coil plate 10 of the flat speaker, a vertical magnetic field is formed by magnetic substances disposed on both surfaces of the voice coil plate 10. When an electrical signal is applied to the first and second outer via holes 121 and 122 of the voice coil plate 10, a Lorentz force is generated by the magnetic field and a current flowing through the plurality of voice coil patterns, and vertically vibrates the voice coil plate 10 and the vibration plate 20.

Hereafter, the stacked structure of the voice coil plate 10 and the connection relation between the plurality of voice coil pattern layers will be described. For convenience of description, the right end of the voice coil plate 10 in FIG. 1 is referred to as a first end, and the left end of the voice coil plate 10 is referred to as a second end. Furthermore, one side of the track-shaped voice coil pattern, close to the first end of the voice coil plate, is referred to as a first end of the track, and the other side of the track-shaped voice coil pattern, close to the second end of the voice coil plate, is referred to as a second end of the track.

FIGS. 2A and 2B illustrate two types of voice coil patterns in a 2n-layer voice coil plate according to an embodiment of the present invention, where n is a natural number equal to or more than 2.

FIG. 2A illustrates a first-type voice coil pattern 130A formed on a first base substrate 111. The first-type voice coil pattern 130A has the same structure as the uppermost voice coil pattern 130 described with reference to FIG. 1. In other words, the first-type voice coil pattern 130A has an outer end connected to the first outer via hole 121 disposed at the first end of the first base substrate 111, forms a track shape similar to a coil wound in the side-to-side direction on the first base substrate 111 from the outer end, and has an inner end connected to the inner via hole 123 disposed in the track shape. The second outer via hole 122 is disposed at the second end of the base substrate 111 outside the track shape, for example, at the opposite position of the first outer via hole 121. However, the first-type voice coil pattern 130A is not electrically connected to the second outer via hole 122.

FIG. 2B illustrates a second-type voice coil pattern 130B formed on a second base substrate 112. The second-type voice coil pattern 130B has an outer end connected to the second outer via hole 122 disposed at the second end of the second base substrate 112, forms a track shape similar to a coil wound in the side-to-side direction on the second base substrate 112 from the outer end, and has an inner end connected to the inner via hole 123 disposed in the track shape or specifically the same inner via hole as the inner via hole 123 disposed in the first voice coil pattern 130A. The first outer via hole 121 is also disposed at the first end of the base substrate 112 outside the track shape, but the second-type voice coil pattern 130B is not electrically connected to the first outer via hole 121.

The multilayer voice coil plate according to the embodiment of the present invention may include n first-type voice coil patterns 130A and n second-type voice coil patterns 130B, where n is a natural number equal to or more than 2. The first voice coil pattern 130A may have the same track shape as or similar track shape to the second voice pattern 130B. Thus, the first and second coil patterns 130A and 130B may be stacked in such a manner that the track shapes thereof overlap each other. More specifically, the line patterns of the adjacent layers, which form the track shape, may be arranged in parallel to each other while crossing each other. Such an arrangement is suitable for releasing heat generated by the voice coil patterns. The n first-type voice coil patterns 130A and the n second-type voice coil patterns 130B are stacked in any order so as to be insulated from each other. In the respective layers, the first outer via holes 121, the second outer via holes 122 and the inner via holes 123 are aligned at the same positions and electrically connected through interlayer conductors.

In the present embodiment, it has been described that the first-type voice coil pattern 130A and the second-type voice coil pattern 130B are disposed on the base substrates 111 and 112, respectively. However, all of the plurality of first-type and second-type voice coil patterns stacked in a multilayer structure do not need to be formed on the base substrates, but a part of the first-type and second-type voice coil patterns may be formed on insulation films for providing electrical insulation from adjacent layers.

In the multilayer voice coil plate having 4, 6, 8 and 2n voice coil pattern layers according to the embodiment of the present invention, all of the voice coil pattern layers may be constructed through the voice coil pattern design using only two types of voice coil patterns or the first-type and second-type voice coil patterns, regardless of the number of layers. From the aspect of the vie holes for electrically connecting layers, the interlayer connection structure can be constructed by only the first and second outer via holes or two outer via holes and one inner via hole. Furthermore, when the positions of the inner via holes are aligned with the center line of the track, the first-type and second-type voice coil patterns may have the mirror symmetry. Thus, all voice coil pattern layers may be substantially constructed through one voice coil pattern design.

However, the present invention is not limited to the above-described embodiment. More specifically, the n first voice coil patterns 130A may have the first outer via holes 121 and the inner via holes 123 which are formed at positions overlapping each other, and the shapes of the track-shaped coil patterns do not need to necessarily coincide with each other. Therefore, each of the n first voice coil patterns 130A may have a different resistance value from the first outer via hole 121 to the inner via hole 123. This aspect is equally applied to the n second voice coil patterns 130B.

Figure 2:
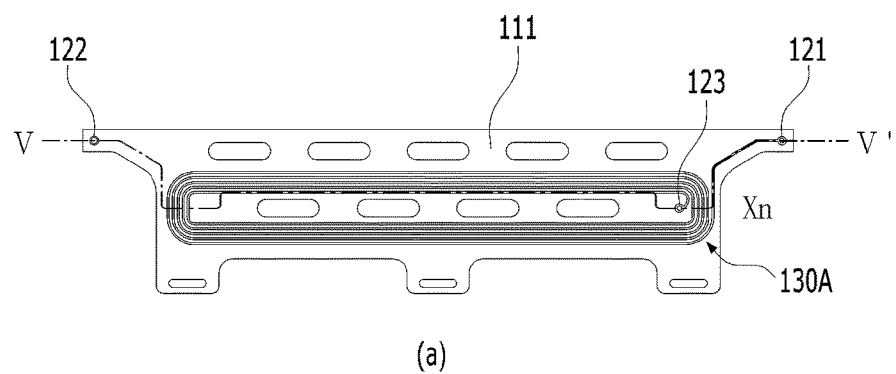
FIG. 2 illustrate two types of voice coil patterns in a 2n-layer voice coil plate according to an embodiment of the present invention.
Figure 2:
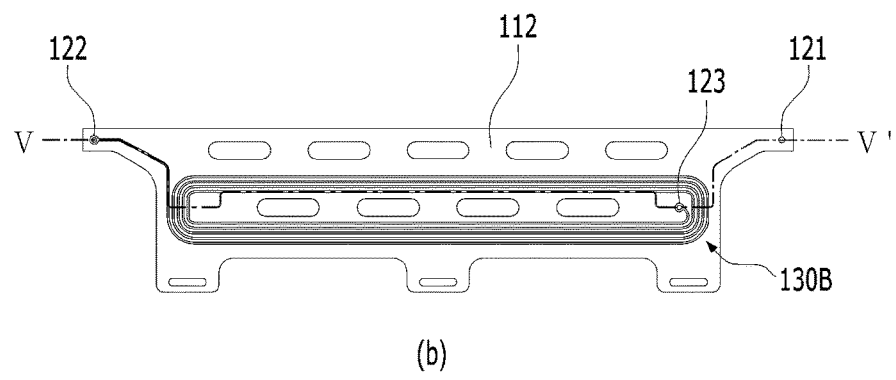

The following descriptions will be focused on a six-layer voice coil plate (n=3) which is a specific example according to the embodiment of FIG. 2.

Figure 3:
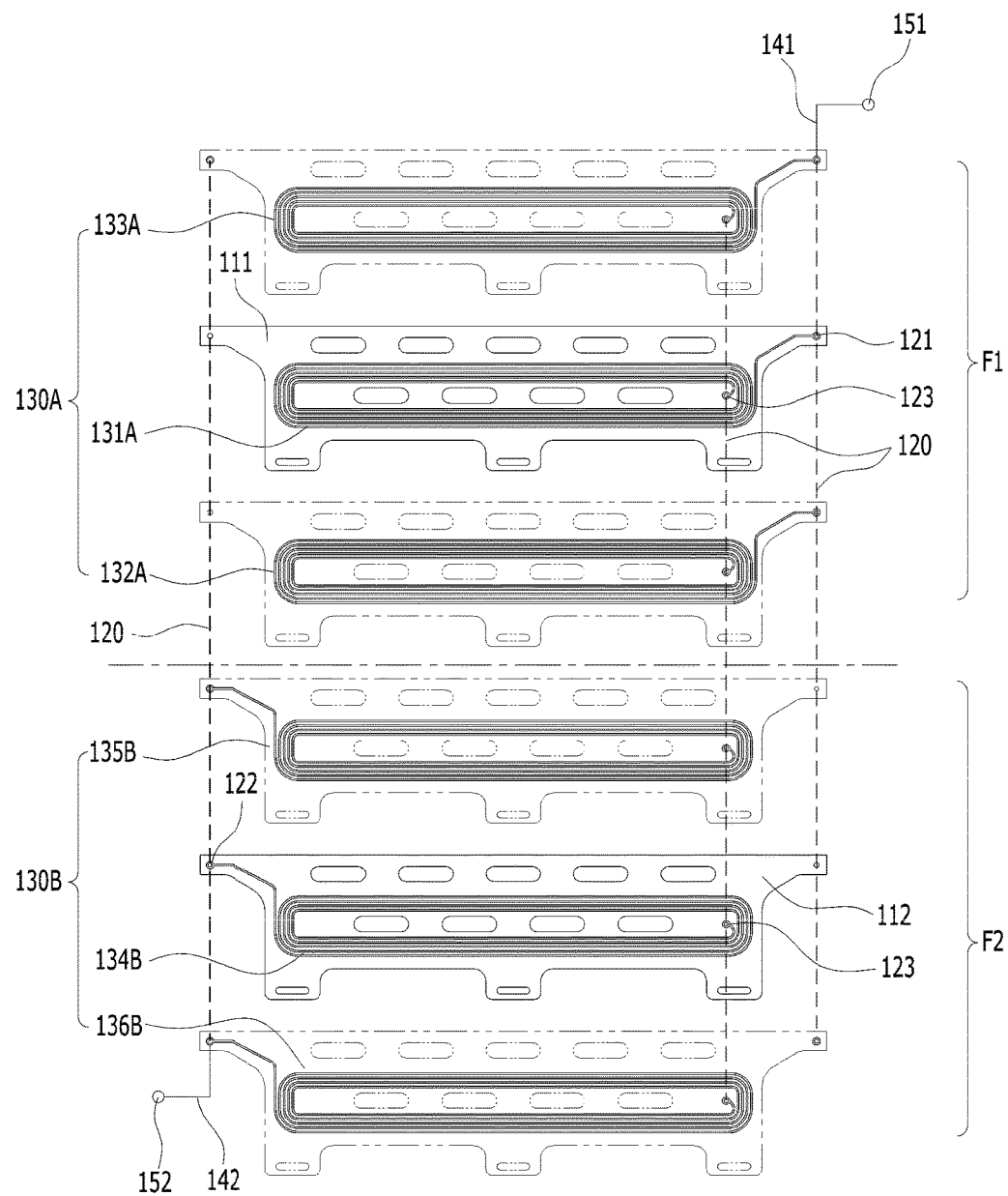
FIG. 3 illustrates an interlayer connection structure of a six-layer voice coil pattern to which the two types of voice coil patterns of FIG. 2 are applied.

FIG. 3 illustrates an interlayer connection structure of a six-layer voice coil pattern to which the two types of voice coil patterns of FIG. 2 are applied.

According to the present embodiment, three first-type voice coil pattern layers 131A, 132A and 133A into which the first-type voice coil pattern 130A is reflected form a first group F1, and three second-type voice coil pattern layers 134B, 135B and 136B into which the second-type voice coil pattern 130B is reflected form a second group F2. The plurality of voice coil pattern layers belonging to the first group F1 are disposed at the top and bottom surfaces of the first base substrate 111, and the plurality of voice coil pattern layers belonging to the second group F2 are disposed at the top and bottom surfaces of the second base substrate 112.

First, the first group F1 will be described in more detail. In the first group F1, one first-type voice coil pattern layer 131A is disposed on the top surface of the first base substrate 111 as an inner voice coil pattern layer adjacent to the substrate, and another first-type voice coil pattern layer 133A is disposed as an outer voice coil pattern layer over the first-type voice coil pattern layer 131A disposed on the top surface of the first base substrate 111. Between the two first-type voice coil pattern layers 131A and 133A, an insulating film is interposed. Furthermore, one first-type voice coil pattern layer 132A is also disposed on the bottom surface of the base substrate 111 as an inner voice coil pattern layer adjacent to the substrate. In the case of the second group F2, three second-type voice coil pattern layers 134B, 135B and 136B may be disposed at the top and bottom surfaces of the second base substrate 112. The second group F2 may have a layer structure which is top-and-bottom symmetrical with the first group F1. The first and second groups F1 and F2 vertically overlap each other with one or more insulating films interposed therebetween.

In the present embodiment, the first-type voice coil pattern layers 131A, 132A and 133A are arranged to belong to the first group F1, and the second-type voice coil pattern layers 134B, 135B and 136B are arranged to belong to the second group F2. However, the present invention is not limited to such an arrangement. For example, a part of the first-type voice coil pattern layers 131A, 132A and 133A may be arranged to belong to the second group F2, and a part of the second-type voice coil pattern layers 134B, 135B and 136B may be arranged to belong to the first group F1.

In the plurality of first-type and second-type voice coil pattern layers, the first outer via holes 121, the second outer via holes 122 and the inner via holes 123 are vertically aligned with each other in the respective layers, and electrically connected through the interlayer conductor 120. The first outer via hole 121 is electrically connected to a first input terminal 151 outside the voice coil plate through a lead wiring 141, and the second outer via hole 122 is also connected to a second input terminal 152 outside the voice coil plate through another lead wiring 142. In the flat speaker, the first input terminal 151 may be disposed close to the first end of the voice coil plate, the second input terminal 152 may be disposed close to the second end of the voice coil plate, and the first and second input terminals 151 and 152 may apply an electrical signal to the voice coil plate through a suspension which also serves as the lead wiring 141.

Figure 4:
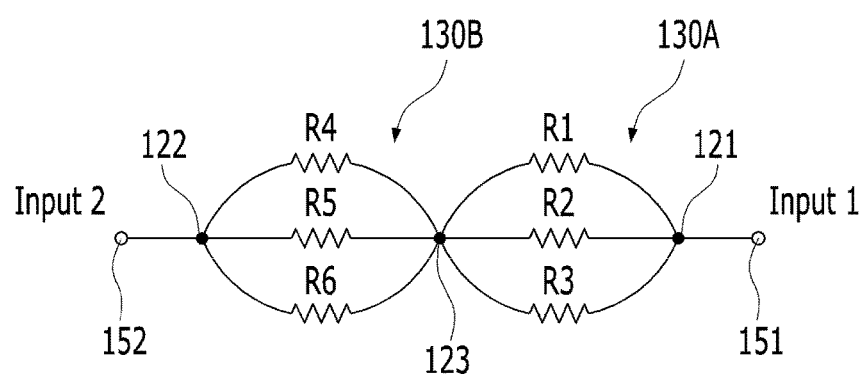
FIG. 4 is an equivalent circuit diagram illustrating resistors of the six-layer voice coil plate of FIG. 3.

FIG. 4 is an equivalent circuit diagram illustrating resistors of the six-layer voice coil plate of FIG. 3.

As illustrated in FIG. 4, three voice coil pattern layers into which the first-type voice coil pattern 130A is reflected form a group of resistors R1, R2 and R3 connected in parallel between the first outer via hole 121 and the inner via hole 123, and three voice coil pattern layers into which the second-type voice coil pattern 130B is reflected form a group of resistors R4, R5 and R6 connected in parallel between the inner via hole 123 and the second outer via hole 122. Between the first and second input terminals 151 and 152, the two resistor groups are connected in series to each other.

The composite resistance of the six-layer voice coil plate according to the present embodiment can be easily calculated. That is because a relation of R1=R2=R3(=Ra) and a relation of R4=R5=R6(=Rb) are established in the six-layer voice coil plate according to the present embodiment. Therefore, the composite resistance of the six-layer voice coil plate may be calculated through a simple equation of R=Ra/3+Rb/3. Furthermore, when the resistance value Ra of the first-type voice coil pattern and the resistance value Rb of the second-type voice coil pattern are equally set to Rp, the composite resistance can be more simply calculated through an equation of R=(2/3)Rp. According to the present embodiment, even when a multilayer voice coil plate having four, six or more layers is designed, a multilayer voice coil plate satisfying a target resistance value can be easily implemented only by designing one or two types of voice coil patterns.

The present invention is not limited to the above-described embodiment, but one or more of the resistors R1, R2 and R3 may have a different value from the other resistors, and one or more of the resistors R4, R5 and R6 may have a different value from the other resistors. In this case, the composite resistance of the entire voice coil plate may be calculated through a method of summing up the resistance values of the two resistor groups connected in series to each other.

Figure 5:
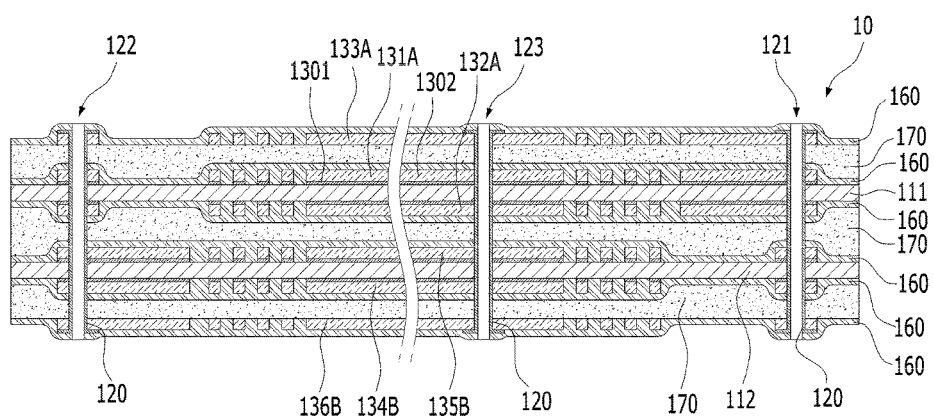
FIG. 5 illustrates a cross-section of the six-layer voice coil plate, taken along the line V-V' of FIG. 2.

FIG. 5 illustrates a cross-section of the six-layer voice coil plate, taken along the line V-V' of FIG. 2.

FIG. 5 illustrates the insulating films 160 for interlayer insulation and surface protection and the connection structure of the interlayer conductor 120 through the via holes 121 to 123 in the six-layer voice coil plate according to the present embodiment.

As described with reference to FIG. 3, the voice coil plate 10 according to the present embodiment may be divided into the first group F1 based on the first base substrate 111 disposed at the upper portion and the second group F2 based on the second base substrate 112 disposed at the lower portion. The first and second groups F1 and F2 may be symmetrically formed while vertically facing each other, and bonded to each other through an adhesive layer 170.

In the first group F1, one first-type voice coil pattern layer 131A is disposed on the top surface of the first base substrate 111 as an inner voice coil pattern layer adjacent to the substrate, and one insulating film 160 is disposed over the first-type voice coil pattern layer 131A. The adhesive layer 170 is disposed over the insulating film 160, and another first-type voice coil pattern layer 133A is disposed as an outer voice coil pattern layer over the adhesive layer 170. Moreover, another insulating film 160 may be disposed as a protective film over the outer voice coil pattern layer. Furthermore, one first-type voice coil pattern layer 132A is also disposed on the bottom surface of the base substrate 111 as an inner voice coil pattern layer adjacent to the substrate. The insulating film 160 is also disposed on the bottom surface of the first-type voice coil pattern layer 132A.

In the second group F2, three second-type voice coil pattern layers 134B, 135B and 136B are disposed at the top and bottom surfaces of the second base substrate 112, while being symmetrical with those of the first group F1. Each of the second-type voice coil pattern layers 134B, 135B and 136B is also covered by an insulating film, and the adhesive layer 170 is disposed between the insulating film 160 on the surface of the inner voice coil pattern layer adjacent to the bottom surface of the second base substrate 112 and the outer voice coil pattern layer at the bottom of FIG. 5.

The interlayer conductors 120 are disposed on the respective inner walls of the first outer via hole 121, the second outer via hole 122 and the inner via hole 123, in order to electrically connect the first outer via hole 121 to all of the first-type voice coil pattern layers 131A, 132A and 133A, electrically connect the second outer via hole 122 to all of the second-type voice coil pattern layers 134A, 135B and 136B, and electrically connect the inner via hole 123 to all of the first and second voice coil pattern layers.

When the inner voice coil pattern layer is in direct contact with the surface of the base substrate, the inner voice coil pattern layer may have a stacked structure of two different metal thin films. For example, a silver (Ag) thin film 1301 may be formed on the surface of polyimide used as the base substrate 111, and a copper (Cu) film 1302 may be formed over the Ag thin film 1301. Then, the resultant structure may be patterned. The stacked structure can not only improve the adhesion of the conductive patterns, but also reduce specific resistance.

The insulating film 160 may include a porous organic insulating film as well as an overlay used for a typical flexible printed circuit board (FPCB). The porous organic insulating film has a relatively small mass in comparison to the thickness and dielectric strength thereof. Thus, the porous organic insulating film can contribute to not only improving the signal response performance of the flat speaker, but also discharging heat generated by the plurality of voice coil pattern layers to the outside. The adhesive layer 170 may also serve as a planarization layer.

INDUSTRIAL APPLICABILITY

The multilayer voice coil plate and the flat speaker including the same according to the embodiment of the present invention may be applied to an audio system or various electronic products included in the audio system. For example, the multilayer voice coil plate and the flat speaker including the same can be effectively applied to products that require a high acoustic output while having a small speaker installation area, like a television having a flat display applied thereto.

The invention claimed is:

1. A multilayer voice coil plate comprising:
   a plurality of first-type voice coil pattern layers, each of the first-type voice coil pattern layer formed in the shape of a track and connected from a first outer via hole outside the track to an inner via hole disposed in the track; and
   a plurality of second-type voice coil pattern layers, each of the second-type voice coil pattern layer formed in the shape of a track and connected from a second outer via hole outside the track to an inner via hole disposed in the track,
   wherein the plurality of first-type voice coil pattern layers and the plurality of second-type voice coil pattern layers are stacked so as to be insulated from each other, and the first outer via holes, the second outer via holes and the inner via holes in the plurality of voice coil pattern layers are electrically connected through interlayer conductors, respectively,
   wherein the inner via holes of the plurality of first-type voice coil pattern layers and the inner via holes of the plurality of second-type voice coil pattern layers are vertically aligned at the same position so that the inner via holes of the plurality of first-type voice coil pattern layers and the inner via holes of the plurality of second-type voice coil pattern layers are electrically connected to each other through one interlayer conductor of the interlayer conductors.

2. The multilayer voice coil plate of claim 1, wherein the plurality of first-type voice coil pattern layers are connected in parallel to each other between the first outer via hole and the inner via hole,
   the plurality of second-type voice coil pattern layers are connected in parallel to each other between the inner via hole and the second outer via hole, and
   the plurality of first-type voice coil pattern layers and the plurality of second-type voice coil pattern layers are connected in series to each other through the inner via hole set to a contact therebetween.

3. A multilayer voice coil plate comprising:
   a pair of base substrates facing each other;
   inner voice coil pattern layers formed on both surfaces of each of the pair of base substrates, respectively;
   insulating films covering the respective surfaces of the inner voice coil pattern layers on both surfaces of each of the pair of base substrates; and
   an outer voice coil pattern layer formed on each of the insulating films of outer surfaces of the pair of base substrates, with an adhesive layer interposed therebetween,
   wherein two insulating films on inner surfaces of the pair of base substrates, facing each other, are bonded to each other with an adhesive layer.

4. The multilayer voice coil plate of claim 3, wherein each of the plurality of voice coil pattern layers including the inner voice coil pattern layers and the outer voice coil pattern layers is a first-type or second-type voice coil pattern layer,
the first-type voice coil pattern layer is formed in the shape of a track and connected from a first outer via hole outside the track to an inner via hole in the track,
the second-type voice coil pattern layer is formed in the shape of a track and connected from a second outer via hole outside the track to the inner via hole in the track, and
the first outer via holes, the second outer via holes and the inner via holes in the plurality of voice coil pattern layers are electrically connected through interlayer conductors, respectively.

5. The multilayer voice coil plate of claim 4, wherein the plurality of voice coil pattern layers comprise the plurality of first-type voice coil pattern layers and the plurality of second-type voice coil pattern layers.

6. The multilayer voice coil plate of claim 4, wherein the plurality of first-type voice coil pattern layers are connected in parallel to each other between the first outer via hole and the inner via hole,
the plurality of second-type voice coil pattern layers are connected in parallel to each other between the inner via hole and the second outer via hole, and
the plurality of first-type voice coil pattern layers and the plurality of second-type voice coil pattern layers are connected in series to each other through the inner via hole set to a contact therebetween.

7. The multilayer voice coil plate of claim 4, wherein the first-type voice coil pattern layer and the second-type voice coil pattern layer are stacked in such a manner that the inner via holes thereof are vertically aligned at the same position.

8. A flat speaker comprising:
a multilayer voice coil plate;
a vibration plate vertically coupled to an upper edge of the multilayer voice coil plate, and configured to vibrate in a direction parallel to the multilayer voice coil plate;
a first input terminal installed adjacent to a first end of the multilayer voice coil plate; and
a second input terminal installed adjacent to a second end of the multilayer voice coil plate,
wherein the multilayer voice coil plate comprises:
a plurality of first-type voice coil pattern layers, each of the first-type voice coil pattern layer formed in the shape of a track and connected from a first outer via hole outside the track to an inner via hole disposed in the track; and
a plurality of first-type voice coil pattern layers, each of the second-type voice coil pattern layer formed in the shape of a track and connected from a second outer via hole outside the track to an inner via hole disposed in the track,
wherein the plurality of first-type voice coil pattern layers and the plurality of second-type voice coil pattern layers are stacked so as to be insulated from each other, and the first outer via holes and the second outer via holes are electrically connected through interlayer conductors, respectively,
wherein the inner via holes of the plurality of first-type voice coil pattern layers and the inner via holes of the plurality of second-type voice coil pattern layers are vertically aligned at the same position so that the inner via holes of the plurality of first-type voice coil pattern layers and the inner via holes of the plurality of second-type voice coil pattern layers are electrically connected to each other through one interlayer conductor of the interlayer conductors.

9. The flat speaker of claim 8,
wherein the plurality of first-type voice coil pattern layers are connected in parallel to each other between the first outer via hole and the inner via hole,
the plurality of second-type voice coil pattern layers are connected in parallel to each other between the inner via hole and the second outer via hole, and
the plurality of first-type voice coil pattern layers and the plurality of second-type voice coil pattern layers are connected in series to each other through the inner via hole set to a contact therebetween.

10. A flat speaker comprising:
a multilayer voice coil plate;
a vibration plate vertically coupled to an upper edge of the multilayer voice coil plate, and configured to vibrate in a direction parallel to the multilayer voice coil plate;
a first input terminal installed adjacent to a first end of the multilayer voice coil plate; and
a second input terminal installed adjacent to a second end of the multilayer voice coil plate,
wherein the multilayer voice coil plate comprises:
a pair of base substrates facing each other;
inner voice coil pattern layers formed on both surfaces of each of the pair of base substrates, respectively;
insulating films covering the respective surfaces of the inner voice coil pattern layers on both surfaces of each of the pair of base substrates; and
an outer voice coil pattern layer formed on the insulating film of each of outer surfaces of the pair of base substrates, with an adhesive layer interposed therebetween,
wherein two insulating films of inner surfaces of the pair of base substrates, facing each other, are bonded to each other with an adhesive layer.

11. The flat speaker of claim 10, wherein each of the plurality of voice coil pattern layers including the inner voice coil pattern layers and the outer voice coil pattern layers is a first-type or second-type voice coil pattern layer,
the first-type voice coil pattern layer is formed in the shape of a track and connected from a first outer via hole outside the track to an inner via hole in the track,
the second-type voice coil pattern layer is formed in the shape of a track and connected from a second outer via hole outside the track to the inner via hole in the track, and the first outer via holes, the second outer via holes and the inner via holes in the plurality of voice coil pattern layers are electrically connected through interlayer conductors, respectively.

12. The multilayer voice coil plate of claim 1, wherein:
each of the first-type and second-type voice coil pattern layers comprises one or more insulating layers, and
the multilayer voice coil plate further comprises adhesive layers disposed between the insulating layers of the first-type and second-type voice coil pattern layers.

13. The flat speaker of claim 8, wherein:
each of the first-type and second-type voice coil pattern layers comprises an insulating layer, and
the multilayer voice coil plate further comprises adhesive layers disposed between the insulating layers of the first-type and second-type voice coil pattern layers.

* * * * *